(12) United States Patent
Nakamura et al.

(10) Patent No.: US 8,144,813 B2
(45) Date of Patent: Mar. 27, 2012

(54) RECEIVING METHOD AND RECEIVING CIRCUIT

(75) Inventors: Makoto Nakamura, Isehara (JP); Yuhki Imai, Yokohama (JP); Masatoshi Tobayashi, Isehara (JP); Yoshikazu Urabe, Atsugi (JP); Hatsushi Iizuka, Atsugi (JP)

(73) Assignees: Nippon Telegraph and Telephone Corporation (JP); NTT Electronics Corporation (JP)

( * ) Notice: Subject to any disclaimer, the term of this patent is extended or adjusted under 35 U.S.C. 154(b) by 1078 days.

(21) Appl. No.: 11/659,413

(22) PCT Filed: Aug. 2, 2005

(86) PCT No.: PCT/JP2005/014088
§ 371 (c)(1),
(2), (4) Date: Feb. 5, 2007

(87) PCT Pub. No.: WO2006/013841
PCT Pub. Date: Feb. 9, 2006

(65) Prior Publication Data
US 2007/0292139 A1 Dec. 20, 2007

(30) Foreign Application Priority Data
Aug. 3, 2004 (JP) .................. 2004-226858

(51) Int. Cl.
*H04L 25/06* (2006.01)
(52) U.S. Cl. ........ 375/318; 375/230; 375/296; 375/297; 375/311; 375/345
(58) Field of Classification Search .................. 375/318, 375/297, 345, 230, 296, 311
See application file for complete search history.

(56) References Cited

U.S. PATENT DOCUMENTS

| | | | | |
|---|---|---|---|---|
| 5,875,049 A | * | 2/1999 | Asano et al. | 398/202 |
| 5,892,609 A | * | 4/1999 | Saruwatari | 398/202 |
| 6,595,708 B1 | * | 7/2003 | Yamashita | 398/202 |
| 6,671,075 B1 | * | 12/2003 | Mizunaga | 398/202 |
| 6,965,257 B2 | * | 11/2005 | Tanaka | 327/58 |

(Continued)

FOREIGN PATENT DOCUMENTS

JP  08-084160  3/1996

(Continued)

OTHER PUBLICATIONS

Nogami et al., "Development of 1.25 Gbit/s Burst Receiver", Information Technology R&D Center, Mitsubishi Electronic Corporation, IEICE General Conference Proceedings 2003 B-10-87, p. 517.

(Continued)

*Primary Examiner* — Kabir A Timory
(74) *Attorney, Agent, or Firm* — Kilpatrick Townsend & Stockton LLP

(57) ABSTRACT

A receiving method according to the present invention adjusts a level of an output voltage signal by switching a gain to be used for converting an inputted current signal to a voltage signal, in a preamplifier. Performing offset compensation on the output voltage signal in an offset compensator, in a post amplifier. Adding a reset signal, whose polarity is made opposite to a polarity of the output voltage signal, to the output voltage signal, in the preamplifier. Detecting the reset signal having added to the output voltage signal, and resetting the offset compensator by use of the detected reset signal, in the post amplifier.

9 Claims, 14 Drawing Sheets

U.S. PATENT DOCUMENTS

2002/0063937 A1 * 5/2002 Kikuchi .................. 359/189
2004/0145419 A1 * 7/2004 Nogami et al. ............ 330/308

FOREIGN PATENT DOCUMENTS

JP        11-112439 A    4/1999
JP        2000-252774 A    9/2000

OTHER PUBLICATIONS

Yamashita, S. et al. "Novel Cell-AGC Technique for Burst-Mode CMOS Pre-Amplifier with Wide Dynamic Range and High Sensitivity for ATM-PON System", 2002, pp. 881-886, IEEE J. Solid-State Circuits, vol. 37, No. 7.

* cited by examiner

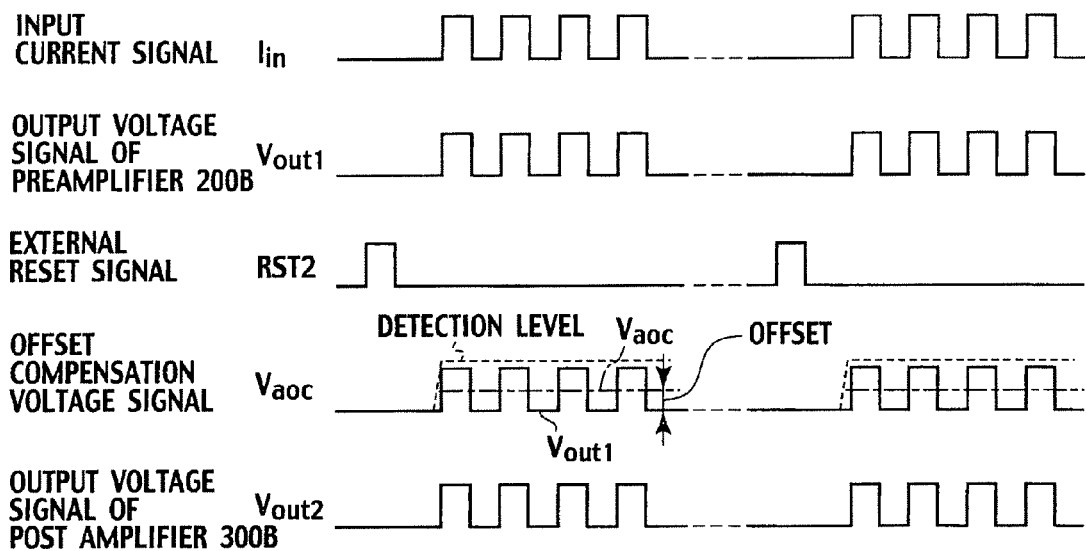
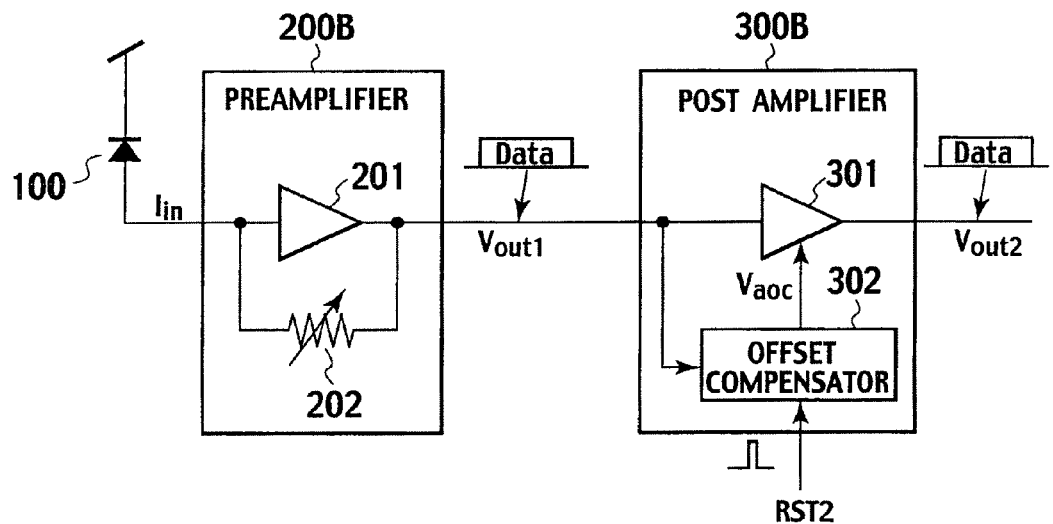

RECEIVING METHOD AND RECEIVING CIRCUIT

TECHNICAL FIELD

The present invention relates to an optical receiving technique for digital signal transmission in an optical communications system. Specifically, the present invention relates to a technique for converting an optical signal into an electric signal (current signal) by use of a light-receiving element, for converting the current signal into a voltage signal, and then for shaping the waveform of the voltage signal and amplifying the voltage signal.

Particularly, the present invention relates to a highly sensitive receiving technique with a wide dynamic range, which can rapidly respond to a burst data signal, and which can handle small to large signals. Specifically, the present invention is adopted as a receiving circuit serving as a component circuit of an optical line terminal (OLT) in an optical subscriber transmission system.

BACKGROUND ART

In the optical subscriber transmission system, especially in a PON (Passive Optical Network) system in which packets of data signals of each subscriber are time-multiplexed, each subscriber has a different signal transmission distance. For this reason, it is necessary to receive optical signals at different receiving levels in an OLT.

In a receiving circuit, it is required to compensate the difference in the receiving levels, and to generate a signal at a certain level so that a discriminator at a subsequent stage can discriminate and reproduce that signal.

There are conventionally known means for compensating a receiving level difference as follows. One is a method in which a gain of an amplifier is controlled by detecting the level of a received signal. The other is a method in which a difference between the level of a received signal and the center value of amplitude, that is an offset, is compensated by detecting the level of a received signal.

Particularly, in the PON system in which packets of a data signal is transmitted at shorter intervals, fast compensation for a receiving level difference is required. Hence, the latter, offset compensation system, enabling a fast response has been used in the PON system. In other words, offset compensators (AOC) are conventionally used for the purpose of achieving higher receiving sensitivity by canceling the offset.

As shown in FIG. 1, a conventional receiving circuit includes a photodiode (PD) 100, a preamplifier 200B and a post amplifier 300B. The preamplifier 200B functions as a trans impedance core circuit for performing current-voltage conversion by use of an amplifier 201 and a feedback resistor 202. The post amplifier 300B compensates an offset of a data signal by use of an amplifier 301 and an offset compensator 302.

FIG. 2 shows a waveform diagram of basic operations of the receiving circuit.

The preamplifier 200B receives a current signal $I_{in}$ obtained by converting an optical signal into an electronic signal by the photodiode 100. The preamplifier 200B then converts and amplifies the received current signal (input current signal) $I_{in}$. Thereby, an output voltage signal $V_{out1}$ (output data signal Data) is generated, and the preamplifier 200B outputs the output voltage signal $V_{out1}$.

The preamplifier 200B is not provided with an offset compensator. For this reason, even when the input current signal $I_{in}$ has a level difference (amplitude difference), the preamplifier 200B generates the output voltage signal $V_{out1}$ while maintaining that level.

The post amplifier 300B at a subsequent stage detects the level of the output voltage signal $V_{out1}$ and compensates an offset. Hence, the post amplifier 300B outputs an output voltage signal $V_{out2}$ having a high-quality waveform without distortion.

Specifically, the post amplifier 300B detects an amplitude difference for each packet of the output data signal Data by use of the offset compensator 302. Thereafter, the post amplifier 300B corrects an offset voltage $V_{aoc}$ which is a difference between the level "0" and the center value of amplitude. The post amplifier 300B then amplifies the corrected voltage by use of the amplifier 301.

In order to detect the level of each packet of the output data signal Data, an external reset signal RST2 for initializing (resetting) the offset compensator 302 is inputted to the offset compensator 302 just before the packet is received.

However, the above-described conventional receiving circuit has the following problem. When the level of the output voltage signal $V_{out1}$ of the preamplifier 200B varies in packets, a level detection error occurs in the offset compensator 302. This leads to deterioration in the offset compensation accuracy, thus causing deterioration in the waveform quality.

Especially, suppose that the value of the feedback resistor 202 is changed to switch a gain as shown in FIG. 3 in order to widen a dynamic range of input to the preamplifier 200B. A problem may occur that a level detection error is caused when a higher gain of the preamplifier 200B is switched to the lower gain. The cause of the level detection error is a notch in the waveform of the output voltage signal $V_{out1}$. The notch occurs when there is a circuit delay between the level detection and the gain switching.

FIG. 4 shows I/O characteristics shown in a case where the value of the feedback resistor 202 of the preamplifier 200B is switched (RF1, RF2, . . . RFn). The ratio of the output amplitude (output voltage signal $V_{out1}$) to the input current signal $I_{in}$ is the gain (conversion gain) of the preamplifier 200B. Thus, the larger the inclination of the line indicating the above ratio in FIG. 4 is, the higher the gain is. Meanwhile, a smaller inclination indicates a lower gain.

In addition, the gain reflects the value of the feedback resistor 202. A higher resistance is used to obtain a higher gain, and a lower resistance is used to obtain a lower gain.

FIG. 5 shows examples of operation waveforms in a case where the value of the feedback resistor 200 is changed.

In a case where the preamplifier 200B is waiting for the incoming of the input current signal $I_{in}$ with the maximum gain (with the resistance value RF1 of the feedback resistor 202), the maximum gain is switched to smaller one when the input current signal $I_{in}$ is sufficiently large (the resistance value RF1 switches to RF2).

At this stage, due to a circuit delay caused by a switch control circuit (not illustrated), a delay in gain switching occurs. For this reason, the top portion of the output voltage signal $V_{out1}$ of the preamplifier 200B has larger amplitude amplified with the gain corresponding to the resistance value RF1.

The offset compensator 302 detects the level of the top portion of the signal (top bit) as the detection level of the output voltage signal $V_{out1}$. For this reason, the level of the output voltage signal $V_{out1}$ corresponding to the resistance value RF2 cannot be detected. In this case, an offset compensation voltage signal $V_{aoc}$ detected by the offset compensator 302 is different from the normal value.

Note that, in addition to the waveform (alternate long and short dash line) of the offset compensation voltage signal $V_{aoc}$, the output voltage signal $V_{out1}$ (solid line) of the preamplifier 200 which is the input signal into the offset compensator 302, and the waveform of the detection level (dashed line) are described in the waveform diagram of the offset compensation voltage signal $V_{aoc}$ shown in FIG. 5. Hence, offset compensation is performed on the output voltage signal $V_{out2}$ of the post amplifier 300B according to the level of the top bit. This results in the following problem. The portions of the output voltage signal $V_{out2}$ having the level corresponding to the resistance value RF2 cannot have a normal waveform output (dashed line) shown in the waveform diagram of the output voltage signal $V_{out2}$ of the post amplifier 300B shown in FIG. 5, and thereby a deformed and deteriorated waveform (solid line) is obtained.

The circuit delay time relative to a signal speed becomes longer especially in a high speed operation. For this reason, there is a problem that the influence of the above problem becomes relatively larger.

In other words, conventionally, the high speed offset compensation is required for the purpose of receiving packets of data signals having different receiving levels. Furthermore, the gain of the preamplifier 200B needs to be switched for the purpose of achieving high sensitivity and a wide dynamic range. However, as the operation speed increases, level variations are more likely to occur in a waveform. Accordingly, an offset compensation error is caused in the offset compensator 302 of the post amplifier 300B. This leads to a problem that the waveform and the transmission characteristics deteriorate.

As described, in the conventional receiving circuit capable of burst transmission, the gain of the preamplifier is switched to widen the dynamic range of the input signal. In the conventional receiving circuit, however, level variations occur due to delay time of the switching control circuit with the high speed operation. This leads to the level detection error of the post amplifier at the subsequent stage, and improper offset correction. As a result, the problem of distortion of waveform and deterioration in sensitivity is caused.

DISCLOSURE OF THE INVENTION

The present invention is made in view of the above problems. An object of the present invention is to provide a receiving method and a receiving circuit, each of which achieves highly sensitive operation with a wide dynamic range while enabling burst transmission.

A first aspect of the present invention is a receiving method, which adjusts a level of an output voltage signal by switching a gain to be used for converting an inputted current signal to a voltage signal in a preamplifier, and which performs offset compensation on the output voltage signal in an offset compensator in a post amplifier, the receiving method comprising the steps of: detecting a level variation of the output voltage signal, and generating a reset signal, in the preamplifier; adding the reset signal, whose polarity is made opposite to a polarity of the output voltage signal, to the output voltage signal, in the preamplifier; and detecting the reset signal having added to the output voltage signal, and resetting the offset compensator by use of the detected reset signal, in the post amplifier.

A second aspect of the present invention is a receiving circuit comprising: a preamplifier configured to convert an inputted current signal into a voltage signal, and includes an amplifier in which a gain used for the conversion is variable; and a post amplifier configured to receive an output voltage signal of the preamplifier, and includes an offset compensator configured to output an offset compensation voltage signal for the output voltage signal, wherein the preamplifier comprising: a level detector configured to detect a level variation of an output voltage signal of the amplifier; a reset signal generator configured to generate a reset signal when the level detector detects the level variation; and an adder which adds the reset signal generated by the reset signal generator to the output voltage signal of the amplifier, the reset signal having a polarity opposite to that of the output voltage signal, wherein the post amplifier includes a reset signal detector configured to receive the output voltage signal of the preamplifier, and to detect the reset signal on the basis of the received output voltage signal, and to reset the offset compensator by use of the detected reset signal.

In the second aspect, the preamplifier and the post amplifier may be differential amplifiers, and the reset signal, which is added to a differential output voltage signal outputted from the preamplifier, may be a differential signal.

In the second aspect, the level detector of the preamplifier may include a comparator configured to detect the level variation of the output voltage signal of the amplifier, and the reset signal generator of the preamplifier may include an AND circuit configured to generate a reset signal whose pulse width corresponds to a delay time of a delay circuit, on the basis of an output signal of the comparator and a signal obtained by delaying and inverting the output signal of the comparator in the delay circuit.

In the second aspect, the comparator of the level detector may be a plurality of comparators having the same comparison reference value or comparison reference values different from one another, and the reset signal generator may include: sets of a delay circuit and an AND circuit, the number of which sets corresponds to the number of the plurality of comparators; and an OR circuit configured to receive an output of the AND circuit of each set, and to output the reset signal.

In the second aspect, the adder of the preamplifier may include a selector configured to select any one of the output voltage signal of the amplifier and a potential set so as to output a signal which has a polarity opposite to that of the output voltage signal, and the selector may be configured to select and output the set potential when the reset signal of the reset signal generator is outputted.

In the second aspect, the reset signal detector of the post amplifier may include a comparator configured to compare the output voltage signal of the preamplifier with a threshold below a potential of the "0" code of the output voltage signal.

In the second aspect, the reset signal detector of the post amplifier may include an operational amplifier in which an offset is set, and the reset signal detector may be configured to compare a positive logic data signal with a negative logic data signal, and thereby detecting the reset signal added to the output data signal of the preamplifier, the positive logic data signal being inputted into one of input terminals of the operational amplifier, and the negative logic data signal being inputted to the other one of the input terminals.

BRIEF DESCRIPTION OF THE DRAWINGS

FIG. 1 is a circuit diagram of a conventional receiving circuit.
[FIG. 2]
FIG. 2 is an operation waveform diagram of the conventional receiving circuit.

[FIG. 3]

FIG. 3 is a circuit diagram of another conventional receiving circuit.

FIG. 4 is a graph showing I/O characteristics in a case where a gain of a conventional preamplifier is variable.

FIG. 5 is an operation waveform diagram of another conventional receiving circuit.

FIG. 6 is a circuit diagram showing a principle and an arrangement of a receiving circuit according to the present invention.

FIG. 7 is an operation waveform diagram of the receiving circuit according to the present invention.

FIG. 8 is a diagram showing effects of the receiving circuit according to the present invention.

FIG. 9 is a circuit diagram of a receiving circuit according to Embodiment 1 of the present invention.

FIG. 10(a) is an operation waveform diagram of the conventional receiving circuit, and FIG. 10(b) is an operation waveform diagram of the receiving circuit according to Embodiment 1 of the present invention.

FIG. 11 is a circuit diagram of a receiving circuit according to Embodiment 2 of the present invention.

FIG. 12 is a circuit diagram of a preamplifier of a receiving circuit according to Embodiment 3 of the present invention.

FIG. 13 is an operation waveform diagram of the preamplifier of the receiving circuit according to Embodiment 3 of the present invention.

FIG. 14 is a circuit diagram of a preamplifier of a receiving circuit according to Embodiment 4 according to the present invention.

FIG. 15 is a circuit diagram of the preamplifier of the receiving circuit according to Embodiment 4 according to the present invention.

FIG. 16 is a circuit diagram of a post amplifier of a receiving circuit according to Embodiment 5 according to the present invention.

FIG. 17 is an operation waveform diagram of the post amplifier of the receiving circuit according to Embodiment 5 according to the present invention.

FIG. 18 is a circuit diagram of a post amplifier of a receiving circuit according to Embodiment 6 according to the present invention.

FIG. 19 is an operation waveform diagram of the post amplifier of the receiving circuit according to Embodiment 6 according to the present invention.

BEST MODES FOR CARRYING OUT THE INVENTION

Figure 6:
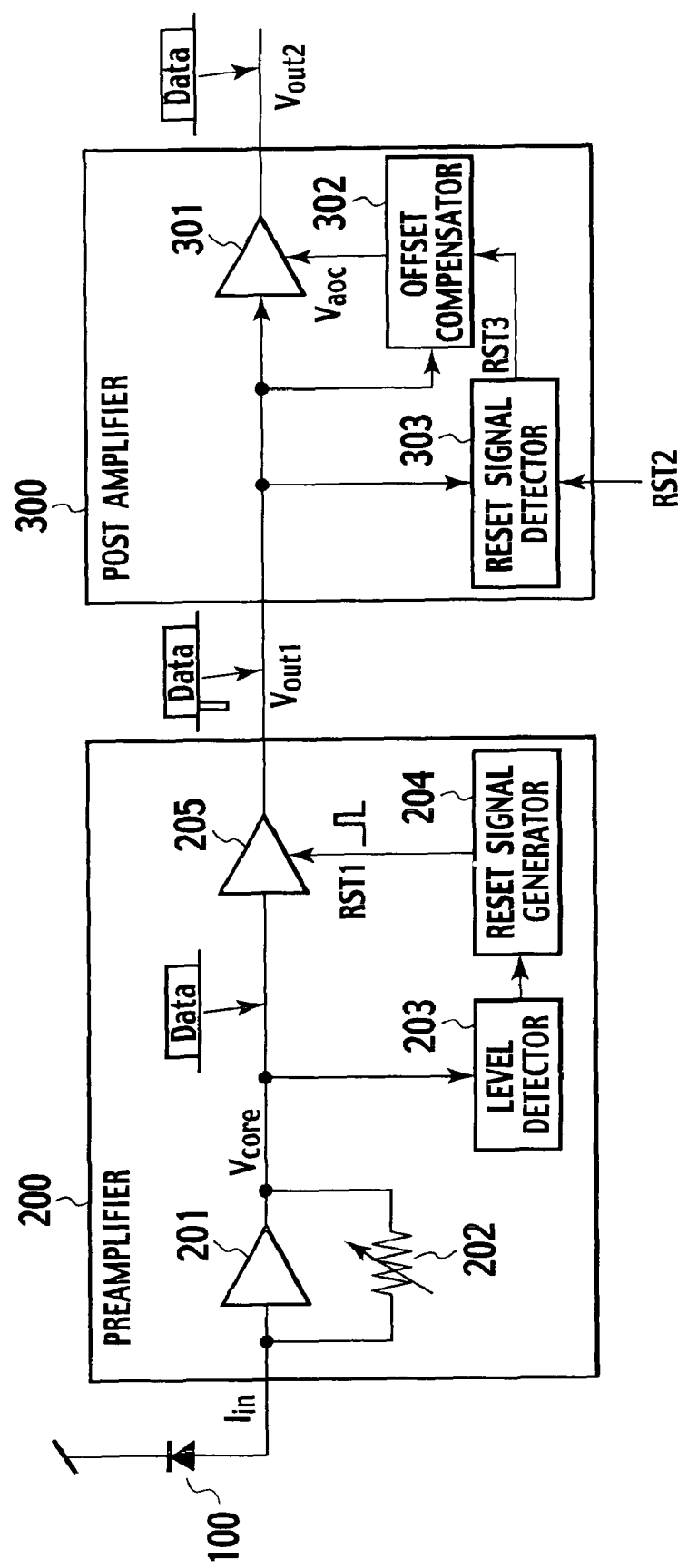
[FIG. 6]

FIG. 6 shows a circuit diagram of a principle arrangement of a receiving circuit according to the present invention. The receiving circuit according to the present invention includes a preamplifier 200 having a gain switching function, and a post amplifier 300 having an offset compensation function.

In the preamplifier 200, an amplifier 201 and a feedback resistor 202 constitute a transimpedance amplifier core circuit which converts a current signal into a voltage signal.

In addition, the preamplifier 200 includes a level detector 203 configured to detect a level variation of an output voltage signal $V_{core}$ (output data signal Data) of the amplifier 201, and a reset signal generator 204 configured to generate an internal reset signal (gain switching notification signal) RST1 each time when the level detector 203 detects a level variation.

In an adder (buffer circuit) 205, the internal reset signal RST1 whose polarity is made opposite to that of the output voltage signal $V_{core}$ is added to the output voltage signal $V_{core}$ of the preamplifier 200. The resultant signal is transmitted to the post amplifier 300.

Note that, the gain switching is performed by switching a resistance value of a feedback resistor 202, and an output of the level detector 203 can be used as a control signal for switching the resistance value.

The post amplifier 300 includes a reset signal detector 303 configured to detect the internal reset signal RST1, in addition to an amplifier 301 and an offset compensator 302. The offset compensator 302 can be reset by use of a reset signal RST3 detected by the reset signal detector 303. Alternatively, the offset compensator 302 may be reset by use of an external reset signal RST2.

With the above arrangement, it is possible to suppress the waveform deterioration of the output data signal due to the gain switching because gain switching is performed in the preamplifier 200, and the offset compensator 302 of the post amplifier 300 can be reset each time when the level of the output voltage signal $V_{core}$ of the amplifier 201 varies.

Figure 7:
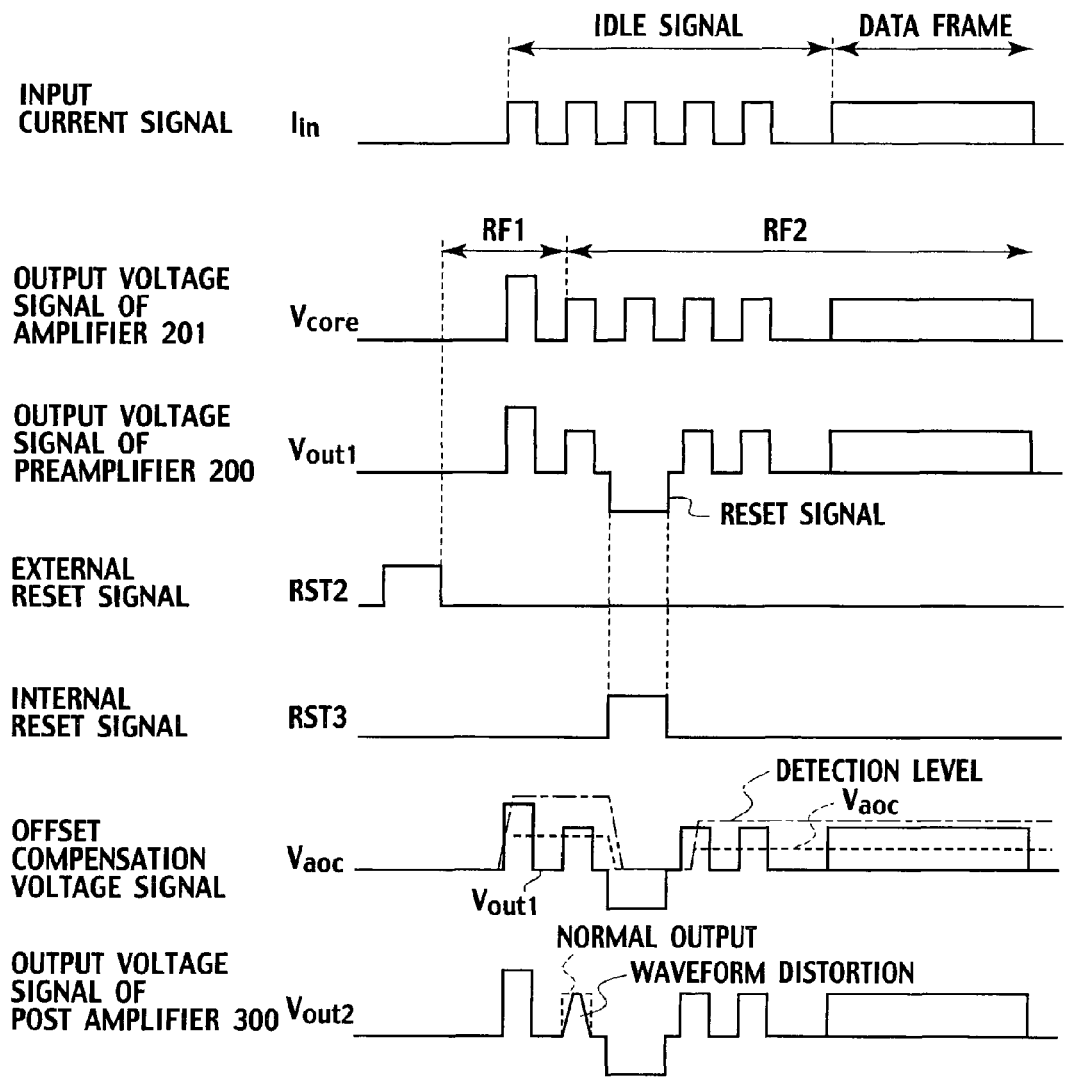
[FIG. 7]

FIG. 7 shows operation waveforms of the receiving circuit according to the present invention shown in FIG. 6. FIG. 7 shows operation waveforms respectively of an input current signal $I_{in}$ of the preamplifier 200, the output voltage signal $V_{core}$ of the amplifier 201, an output voltage signal $V_{out1}$ of the preamplifier 200, the external reset signal RST2, the internal reset signal RST3, an offset compensation voltage signal $V_{aoc}$, and an output voltage signal $V_{out2}$ of the post amplifier 300.

As shown in FIG. 7, an idle signal for settling the receiving circuit is attached in front of a data frame for information transmission in the input current signal $I_{in}$. The receiving circuit needs to be stabilized within the time of the idle signal.

In addition, a receiving circuit capable of responding rapidly is required because the transmission efficiency improves when the time of the idle signal is short.

The preamplifier 200 is set in the initial state as waiting for the input current signal $I_{in}$ (input data signal) with the maximum gain (the resistance value of the feedback resistor 200 is RF1). In this state, the preamplifier 200 operates with the maximum gain for an input current signal $I_{in}$ (input data signal) at a lower level. However, in the case of the input current signal $I_{in}$ (input data signal) at a higher level, the maximum gain is switched to a lower gain (the resistance value of the feedback resistor 202 is RF2). Note that RF2 is smaller than RF1.

When an operation delay occurs in the gain switching, the output data, following the beginning of the input data signal, and including its top portion having large amplitude corresponding to the higher gain, are outputted, as shown in the output voltage signal $V_{core}$ of the amplifier 201. However, the level detector 203 detects the level variation, the reset signal generator 204 generates the internal reset signal RST1, and the rest signal RST 1 is added to the input data signal. Hence, the waveform of the output voltage signal $V_{out1}$ shown in FIG. 7 is obtained.

Here, if the internal reset signal RST1, whose polarity is the same as that of the input data signal, is added to the input data signal, the internal reset signal and the input data signal cannot be distinguished from each other. For this reason, the internal reset signal RST 1, whose polarity is made opposite to that of the input data signal, is added thereto.

In the reset signal detector 303 of the post amplifier 300, the internal reset signal RST1 having added to the input data signal is extracted and is then used as the reset signal RST3 for resetting the offset compensator 302.

The delay time of the gain switching in the preamplifier 200 causes the level variation as shown in the waveform diagram of the output voltage signal $V_{out1}$ of the preamplifier 200 in FIG. 7. However, even though the level of the top pulse of the output voltage signal $V_{out1}$ of (solid line) of the preamplifier 200 is higher, the level of offset compensation voltage signal $V_{aoc}$ (dotted line) is reset to "0" level by use of the reset signal RST 3 as shown in the waveform diagram of the offset compensation voltage signal $V_{aoc}$ in FIG. 7.

In other words, the reset signal RST3 is detected for each time of gain switching of the preamplifier 200. Even if the level variation occurs due to delay time of the gain switching in the preamplifier 200, the offset compensator 302 is reset for each time.

Meanwhile, the offset compensation voltage signal $V_{aoc}$ is not appropriate before the reset signal RST3 is inputted. The waveform distortion of the output voltage signal $V_{out2}$ of the post amplifier 300 occurs as shown in the waveform diagram of the output voltage signal $V_{out2}$ of the post amplifier 300 in FIG. 7. However, the output voltage signal $V_{out2}$ of the post amplifier 300 having an appropriate waveform is outputted after the reset signal RST3 is inputted.

Even though the level of the output voltage signal $V_{out1}$ of the preamplifier 200 varies due to the gain switching in the receiving circuit according to the present invention, it is possible to initialize (reset), for each time of gain switching, the offset compensation voltage signal $V_{aoc}$ of the offset compensator 302 of the post amplifier 300 at the subsequent stage. Hence, it is possible to realize a wider dynamic range and a rapid response.

Figure 1:
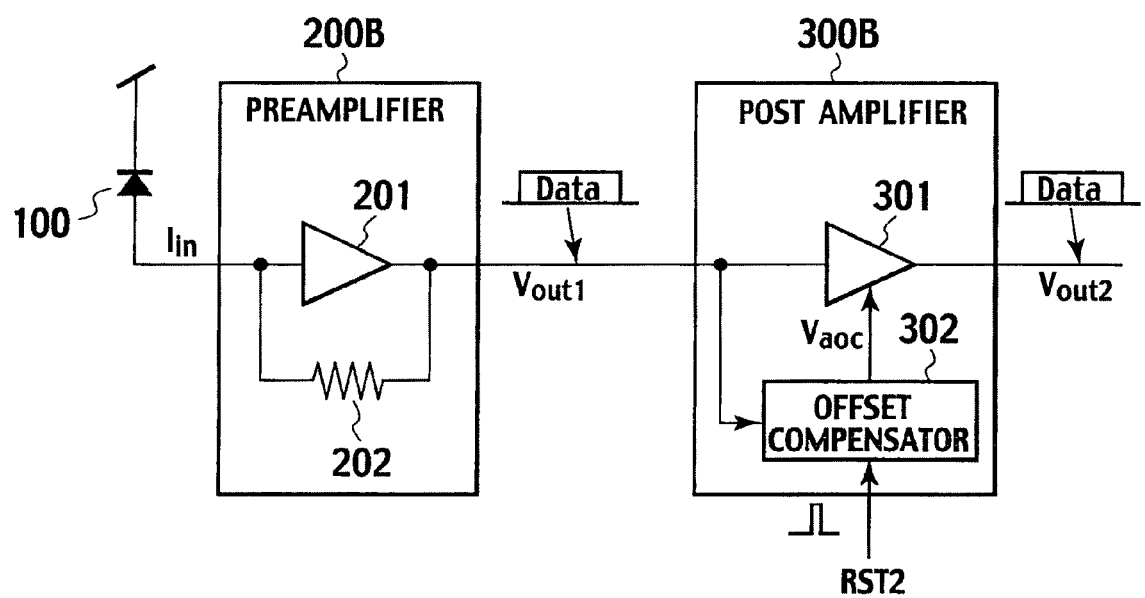
[FIG. 1]
Figure 4:
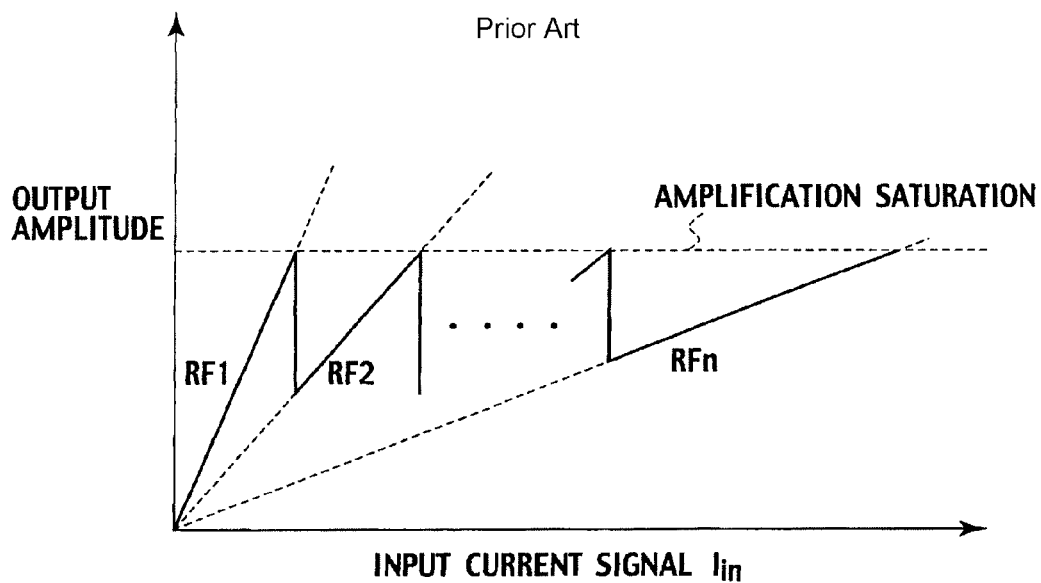
[FIG. 4]
Figure 5:
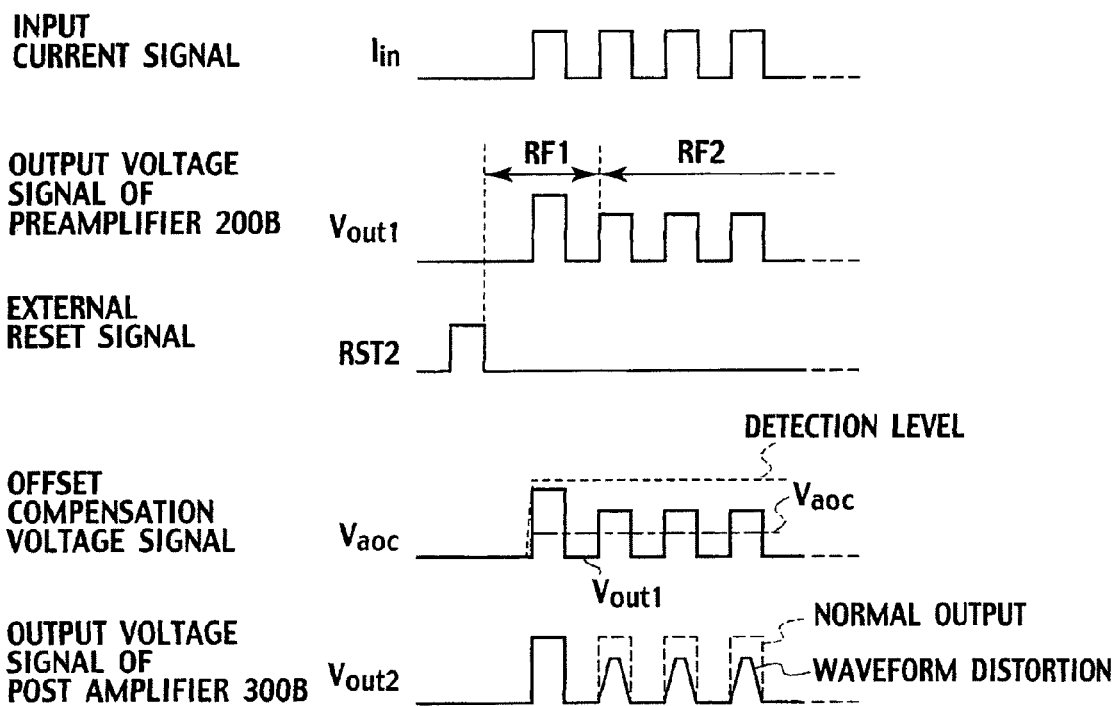
[FIG. 5]
Figure 8:
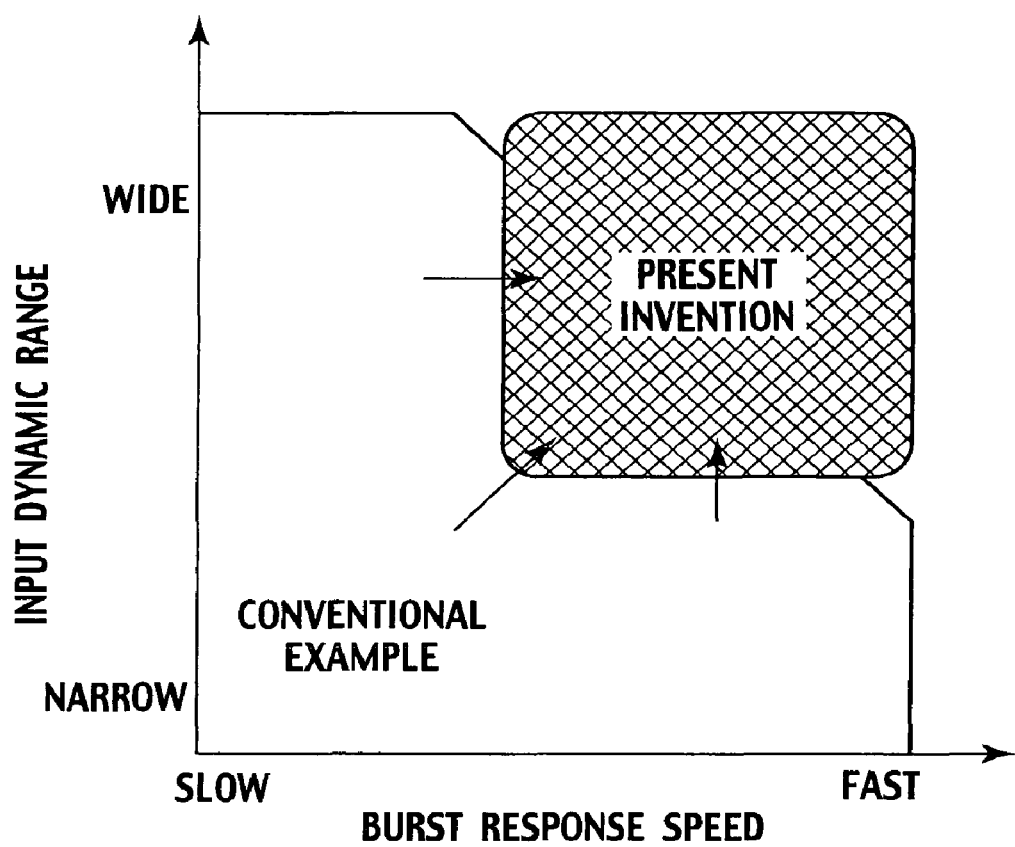
[FIG. 8]

FIG. 8 shows an outline of effects of the present invention. The receiving circuit of the conventional techniques shown in FIGS. 1 to 3 cannot rapidly respond to the burst data signal in the case of achieving a wider dynamic range. In addition, a wider dynamic range cannot be achieved in the case of rapidly responding to the burst data signal. However, the present invention can provide a highly-sensitive receiving circuit with a wider dynamic range, which is capable of handling burst transmission.

[Embodiment 1]

Figure 9:
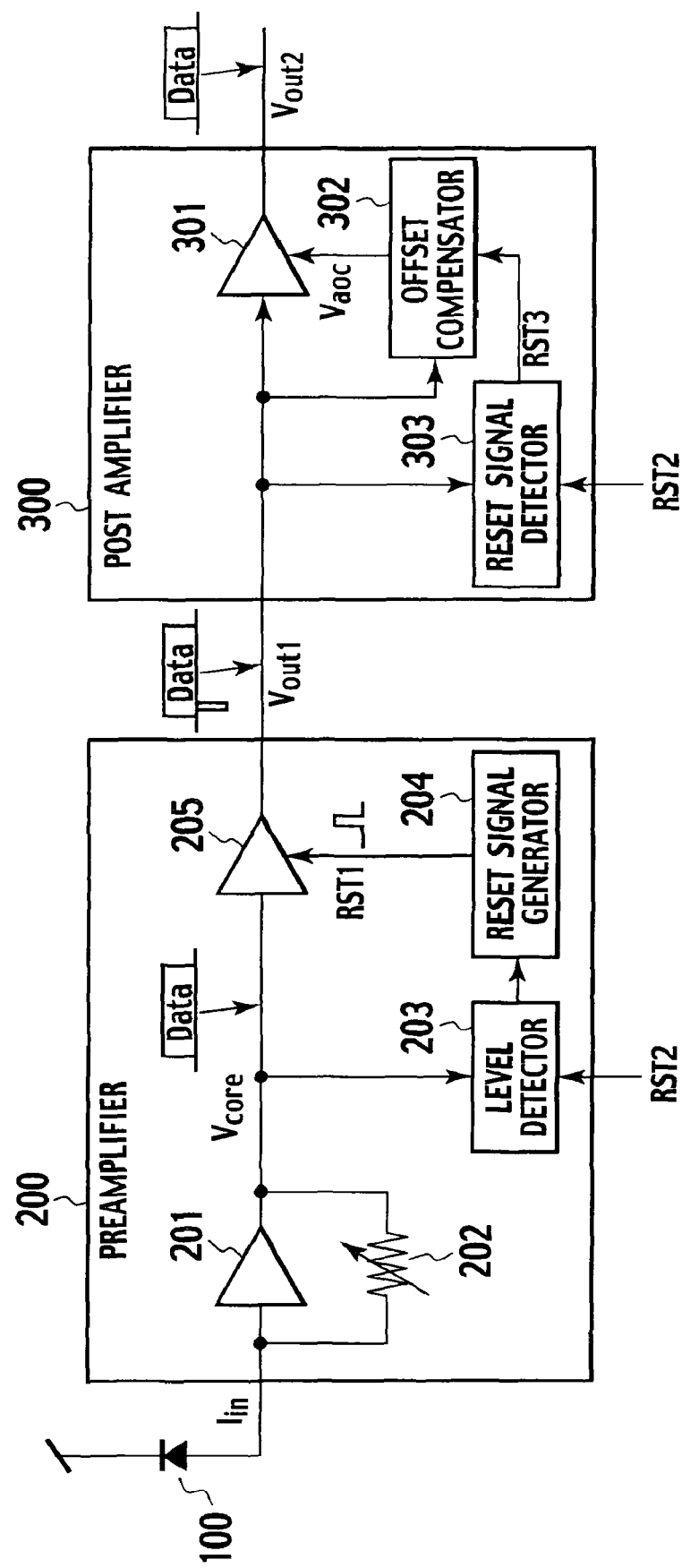
[FIG. 9]

FIG. 9 shows a receiving circuit according to Embodiment 1 of the present invention. In FIG. 9, the same reference numerals used in FIG. 6 are used for the same circuits and signals as those described in FIG. 6. The receiving circuit of Embodiment 1 is configured so that an external reset signal RST2 is inputted to a level detector 203 and a reset signal detector 303.

Figure 10:
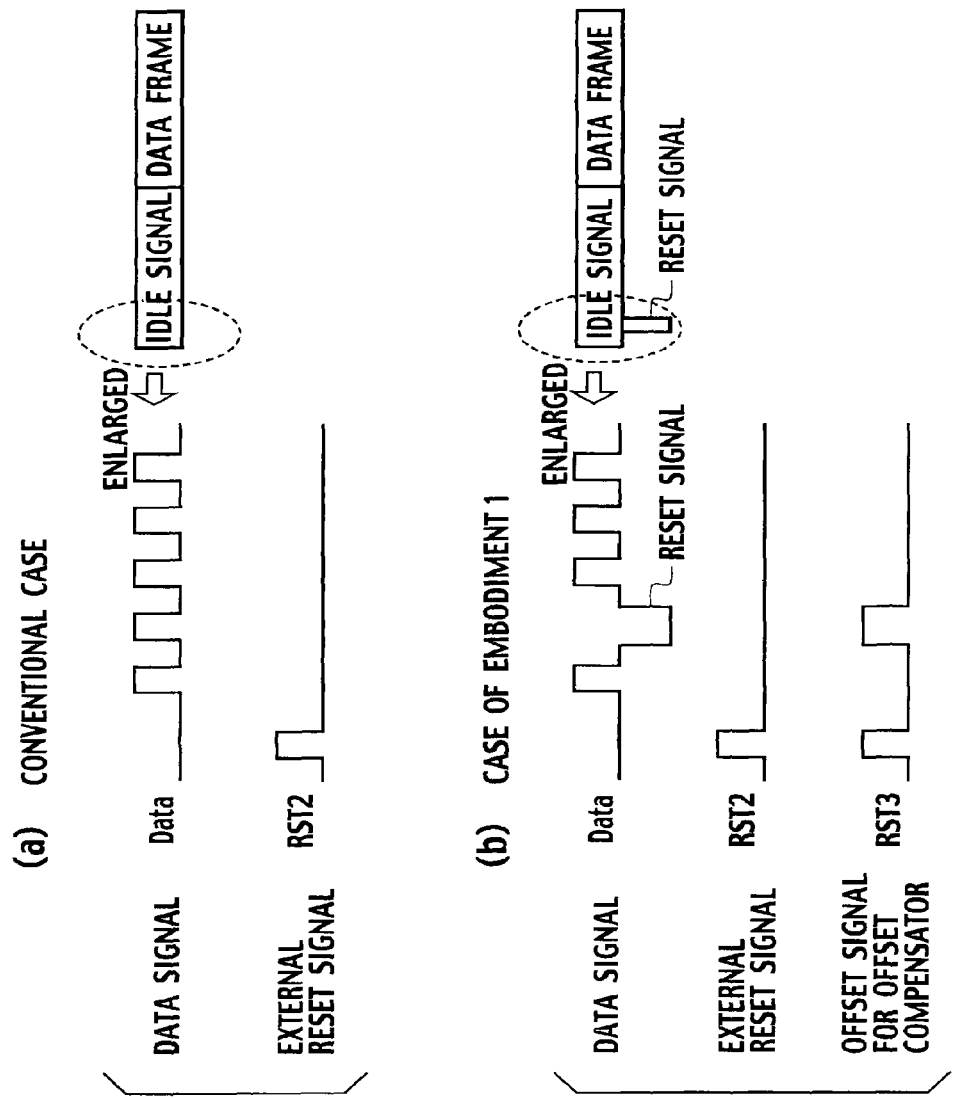
[FIG. 10]

FIG. 10(*b*) shows operation waveforms of the receiving circuit according to Embodiment 1. In each of the conventional receiving circuits described by referring to FIGS. 1 to 3, only the output data signal Data is transmitted from the preamplifier 200B to the post amplifier 300B. In addition, only the external reset signal RST2 serves as the reset signal for the offset compensator 302 of the post amplifier 300B (refer to FIG. 10(*a*)).

Meanwhile, in a case where a gain is switched in the receiving circuit of Embodiment 1, an internal reset signal RST1, whose polarity is made opposite to that of the output data signal Data, and an idle signal portion of a packet of the output signal data are multiplexed. The multiplexed data signal is transmitted from a preamplifier 200 to a post amplifier 300.

Accordingly, even though an amplitude level of an output voltage signal of the preamplifier 200 varies due to gain switching of the core circuit of the transimpedance amplifier, the offset compensator 302 can be reset again.

In the receiving circuit according to Embodiment 1, by receiving the external reset signal RST 2, the level detection operation is initialized in the level detector 203. In addition, the reset signal detector 303 outputs the reset signal RST3 to the offset compensator 302 as well by receiving the external reset signal RST2.

In the preamplifier 200 of a receiving circuit of Embodiment 2, a differential signal is generated by a core circuit consisting of a differential amplifier 201A and feedback resistors 202A and 202B. A differential level detector 203A performs level detection for generating a reset signal RST1. The generated reset signal RST1 and the differential data signal are multiplexed and then the multiplexed differential data signal is transmitted to a post amplifier 300.

Meanwhile, the post amplifier 300A receives the differential data signal. Thereafter, a differential reset signal detector 303A extracts a reset signal RST3, and then, a differential offset compensator 302A is reset depending on a gain variation.

[Embodiment 2]

Figure 11:
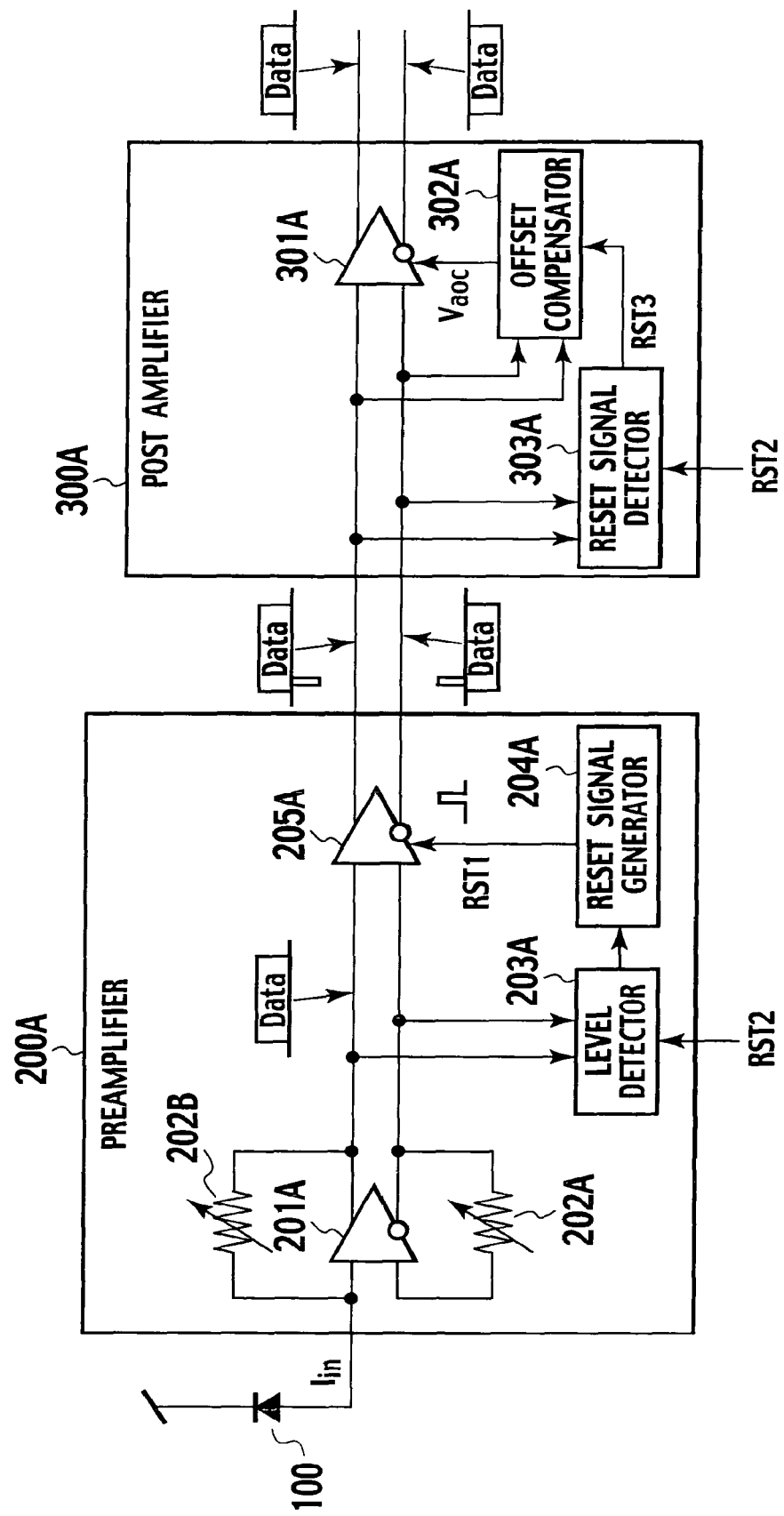
[FIG. 11]

FIG. 11 shows the receiving circuit according to Embodiment 2. In the receiving circuit according to Embodiment 2, an input data signal is a differential signal. In accordance with that signal, the preamplifier 200A and the post amplifier 300A are conFIGured of differential amplifiers. In addition, the output data signal transmitted and received by the preamplifier 200A and the post amplifier 300A is a differential signal as well. Furthermore, the internal reset signal RST1 to be added to the output data signal Data which is a differential signal is a differential signal as well.

The above arrangement of the receiving circuit of Embodiment 2 enables stable signal transmission which is not susceptible to noise even when the transmission is performed at high speed.

As shown in FIG. 11, the preamplifier 200A of the receiving circuit of Embodiment 2 includes the differential amplifier 201A, the feedback resistors 202A and 202B, the level detector 203A, a reset signal generator 204A and a differential adder (buffer circuit) 205A.

In addition, the post amplifier 300A of the receiving circuit of Embodiment 2 includes a differential amplifier 301A, an offset compensator 302A and a reset signal detector 303A.

[Embodiment 3]

Figure 12:
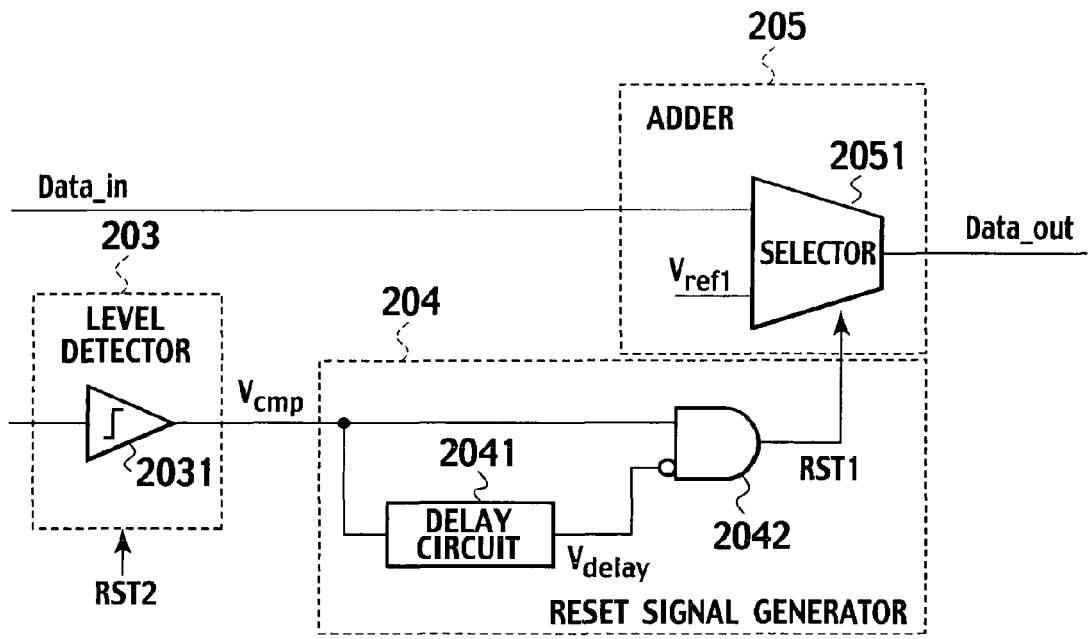
[FIG. 12]

FIG. 12 shows a specific example of a preamplifier 200 of a receiving circuit (the receiving circuit shown in FIG. 9) according to Embodiment 3 of the present invention.

As shown in FIG. 12, the level detector 203 is configured of a hysteresis comparator 2031 which is reset by use of an external reset signal RST2.

In addition, the reset signal generator 204 is composed by a delay circuit 2041 and an AND circuit 2042.

Furthermore, the adder 205 is composed by a selector 2051. Note that the selector 2051 is configured to select, as an output data signal Data_out of the preamplifier 200, an output voltage signal $V_{core}$ (an input data signal Data_in of the adder 205), or a voltage signal $V_{ref1}$ whose polarity is opposite to that of the input data signal Data_in (a potential set so that a signal, whose polarity is made opposite to that of the output voltage signal $V_{core}$, is outputted).

Figure 13:
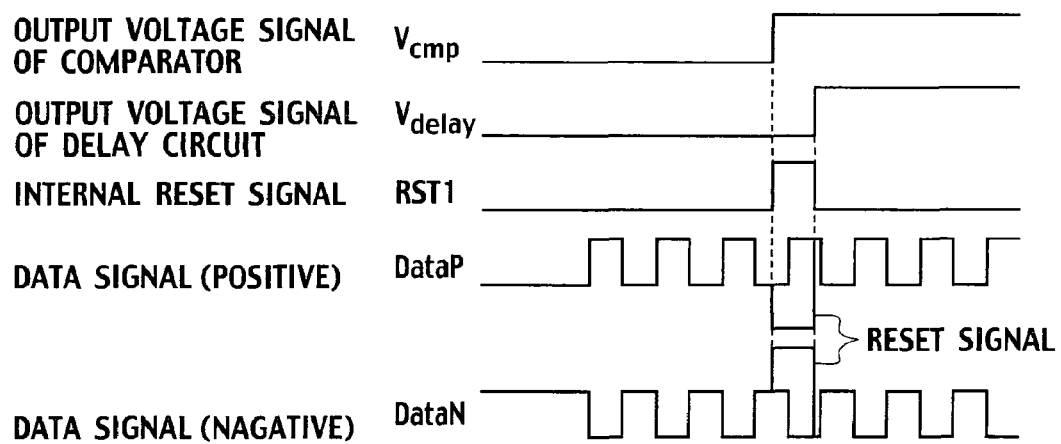
[FIG. 13]

FIG. 13 shows operation waveforms of the receiving circuit according to Embodiment 2.

The comparator 2031 is configured to set an output voltage signal $V_{cmp}$ of the comparator 2031 at a higher level in a case where the output voltage signal $V_{core}$ of the amplifier 201 is at a level higher than a certain level. The output voltage signal $V_{cmp}$ of the comparator 2031 is directly inputted into the AND circuit 2042, while being inputted thereinto via the delay circuit 2041.

The AND circuit 2042 is configured to generate an internal reset signal RST1 whose pulse width corresponds to a delay time of the delay circuit 2041.

The selector 2051 is configured as follows. The selector 2051 selects and outputs the input data signal Data_in of the adder 205 when the internal reset signal RST1 is at a lower level. The selector 2051 selects and outputs the voltage signal $V_{ref1}$ whose polarity is opposite to that of the input data signal Data_in of the adder 205 when the internal reset signal RST1 is at a higher level.

As described, once the level of the output voltage signal $V_{core}$ of the amplifier 201 exceeds a certain level, the internal reset signal RST1 is generated. During a time when the internal reset signal RST 1 is being outputted, the voltage signal $V_{ref1}$, whose polarity is opposite to that of the input data signal Data_in, is outputted as the output data signal Data_out (in other words, the internal reset signal RST1 is added to the input data signal of the adder 205).

A specific differential output waveforms of the output data signal including the internal reset signal RST1 are shown by the waveforms of data signal (positive) DataP and a data signal (negative) Data N in FIG. 13. During the time when the reset signal RST1 is being outputted, the data signal, whose polarity is opposite to that of the reset signal, is outputted.

[Embodiment 4]

Figure 14:
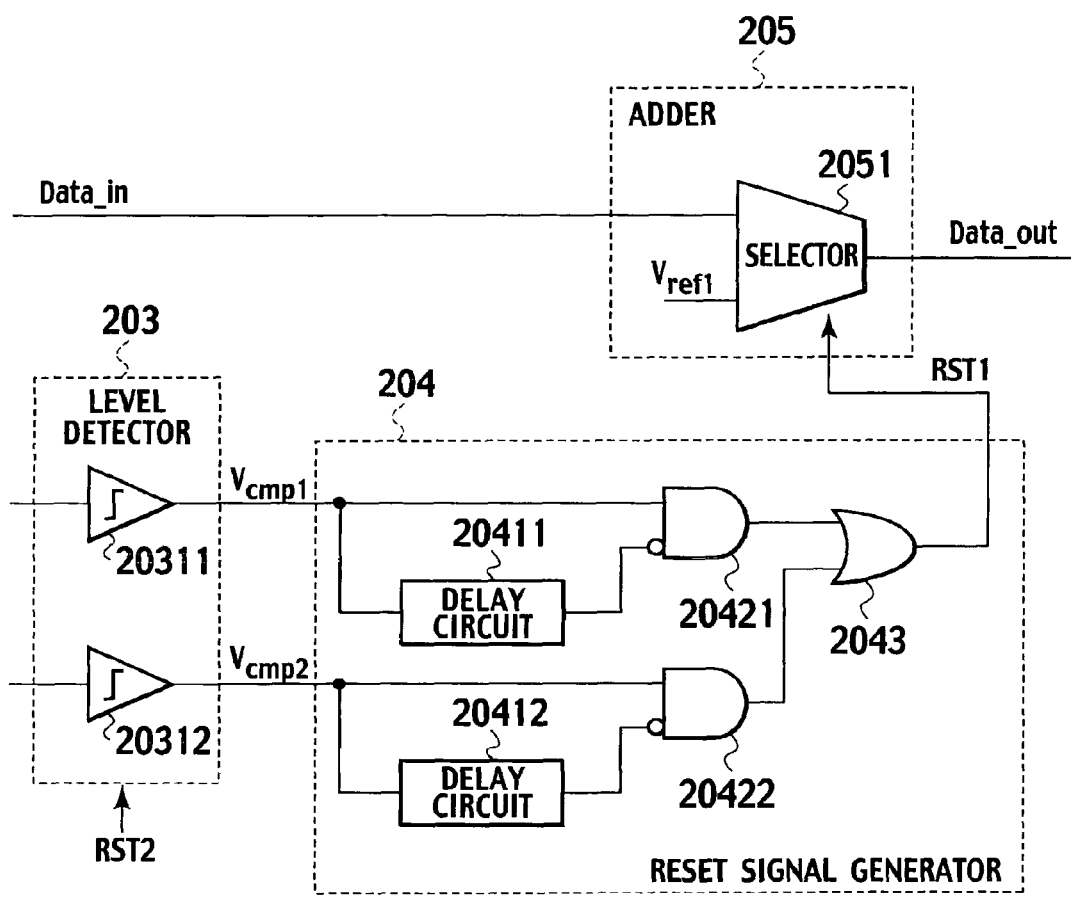
[FIG. 14]
Figure 15:
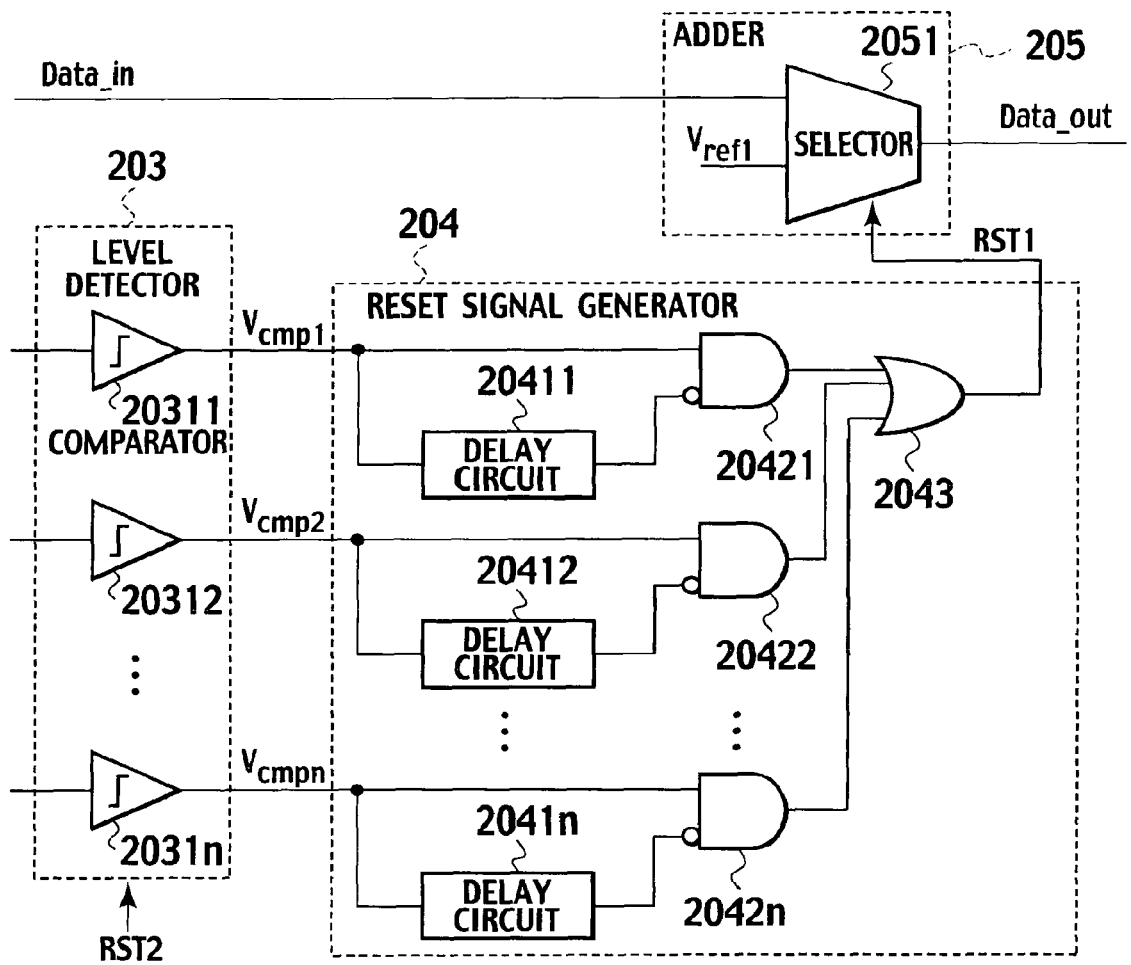
[FIG. 15]

FIGS. 14 and 15 show preamplifiers of a receiving circuit according to Embodiment 4 of the present invention. A preamplifier 200 of the receiving circuit according to Embodiment 4 is configured so that its gain can be switched to any one of a plurality of stages.

The preamplifier 200 shown in FIG. 14 is configured so that the gain can be switched to three stages, for instance, small, medium and large.

In FIG. 14, a level detector 203 is configured of two hysteresis comparators 20311 and 20312. A reset signal generator 204 is composed by two delay circuits 20411 and 20412, two AND circuits 20421 and 20422, and an OR circuit 2043.

In FIG. 15, a level detector 203 is composed by n hysteresis comparators 20311 to 2031n. A reset signal generator 204 is composed by n delay circuits 20411 to 2041n, n AND circuits 20421 to 2042n and an OR circuit 2043.

When the resistance value of a feedback resistor 202 is switched to a different value for a plurality of times, the amplitude of an output voltage signal $V_{core}$ of an amplifier 201 is sequentially changed in response to the switching. With the sequential changes, different comparators are sequentially operated (a comparator once operated for detection maintains its detection state as long as not reset by an external reset signal RST2). For each operation, an internal reset signal RST1 is generated in the corresponding AND circuit, and the internal reset signal RST1 is outputted to an adder 205 via the OR circuit 2043.

As described, even when the gain is switched to any one of three types or more, the internal reset signal RST1 is outputted to the adder 205 for each gain switching. Thereafter, the reset signal RST1 is added to an input data signal Data_in of the adder 205.

[Embodiment 5]

Figure 16:
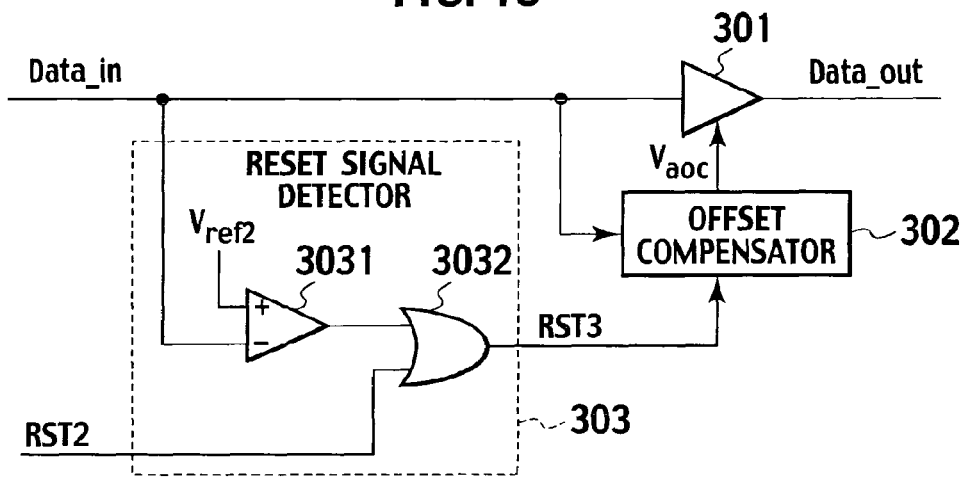
[FIG. 16]

FIG. 16 shows a specific example of a post amplifier 300 of a receiving circuit (the receiving circuit shown in FIG. 9) according to Embodiment 5 of the present invention.

As shown in FIG. 16, a reset signal detector 303 is composed by a comparator 3031 and an OR circuit 3032. In the comparator 3031, a reference value (threshold) $V_{ref2}$ is set. To the OR circuit 3032, an output signal of the comparator 3031 and an external reset signal RST2 are inputted.

The reference value $V_{ref2}$ here is set at a value lower than that of a potential $V_0$ of "0" code of an input data signal Data_in of the post amplifier 300.

Figure 17:
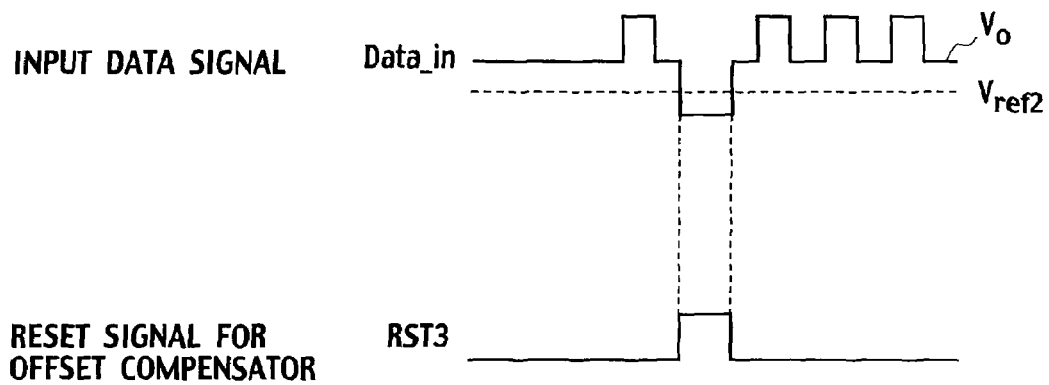
[FIG. 17]

FIG. 17 shows operation waveforms of the receiving circuit according to Embodiment 5 of the present invention.

An input data signal Data_in, to which an internal reset signal RST1 is added, is inputted to the post amplifier 300.

The comparator 3031 compares the input data signal Data_in with the reference value (threshold) $V_{ref2}$. When the input data signal Data_in is lower than the reference value $V_{ref2}$, the reset signal detector 303 outputs a reset signal RST3.

Because the internal reset signal RST1 added to the input data signal Data_in has a polarity opposite to that of the input data signal Data_in as described, the internal reset signal RST1 can be detected by setting the reference value $V_{ref2}$ as described.

The internal reset signal RST1 detected in the above manner or an external reset signal RST2 is inputted from the OR circuit 3032 to an offset compensator 302 as a reset signal RST3.

[Embodiment 5]

Figure 18:
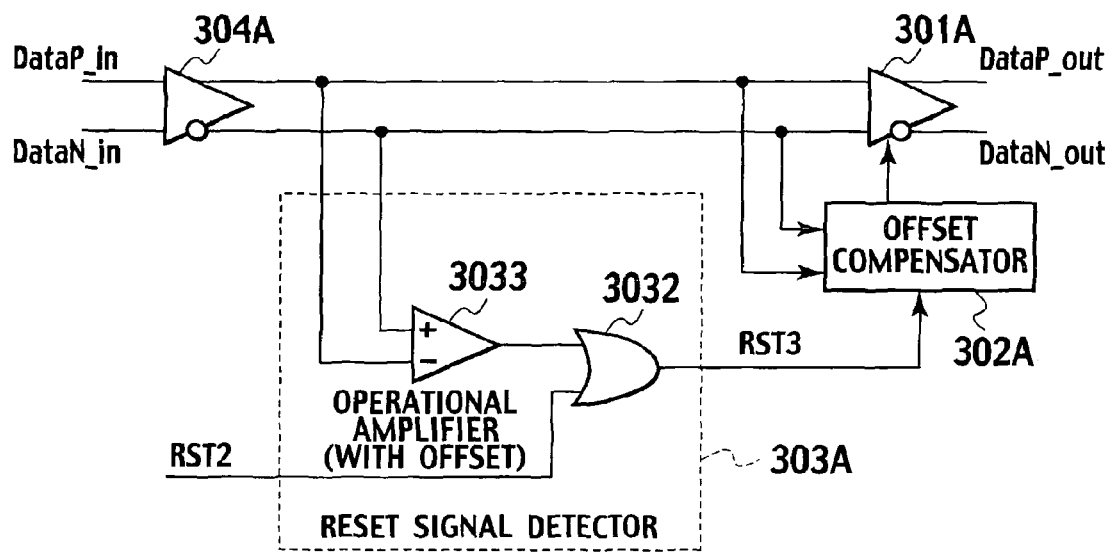
[FIG. 18]

FIG. 18 shows a specific example of a post amplifier 300 of a receiving circuit (the receiving circuit shown in FIG. 9) according to Embodiment 6 of the present invention.

As shown in FIG. 18, a reset signal detector 303A is composed by an operational amplifier 3033, in which an offset $V_{off}$ is set, and an OR circuit 3032.

Figure 19:
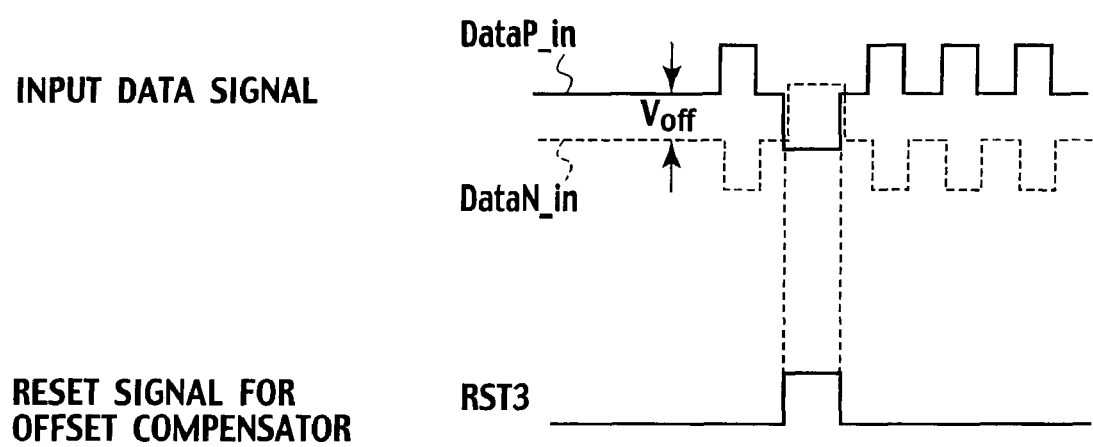
[FIG. 19]

FIG. 19 shows operation waveforms of a receiving circuit of Embodiment 6 according to the present invention.

A positive data signal DataP_in and a negative data signal DataN_in, to each of which an internal reset signal RST1 is added, are inputted to the post amplifier 300.

Both of the data signals are inputted to the operational amplifier 3033 in which the offset $V_{off}$ is set. The offset $V_{off}$ makes the DataP_in positive to the DataN_in. Once the data signals are inputted, only the internal reset signals RST1 are detected. One of the internal reset signals RST1 has the polarity made opposite to that of the Data signal DataP_in, and is added thereto. The other internal reset signal RST1 has the polarity made opposite to that of the Data signal DataN_in, and is added thereto.

The internal reset signal RST1 thus detected or an external reset signal RST2 is inputted from the OR circuit 3032 to an offset compensator 302 as a reset signal RST3.

Industrial Applicability

As described, the present invention allows a receiving circuit of a digital transmission system to rapidly respond to a burst data signal with high sensitivity and a wider dynamic range. Accordingly, high sensitivity characteristic can be obtained without using an expensive APD (avalanche photodiode), and thereby the cost of a transmission device can be reduced. Especially, the device can respond to burst data signals, thereby being effective in an optical access system.

The invention claimed is:

1. A receiving method, which adjusts a level of an output voltage signal by switching a gain to be used for converting an inputted current signal to a voltage signal in a preamplifier, and which performs offset compensation on the output voltage signal in an offset compensator in a post amplifier, the receiving method comprising the steps of:

in the preamplifier:
detecting a level variation of the output voltage signal, and generating a first reset signal in response to the detected level variation;
adding the first reset signal, whose polarity is made opposite to a polarity of the output voltage signal, to the output voltage signal to generate a preamplifier output voltage signal; and in the post amplifier:
providing the preamplifier output voltage signal to the offset compensator;
extracting, by a reset signal detector, the first reset signal with polarity opposite the polarity of the output voltage signal from the preamplifier output voltage signal and producing a second reset signal; and
resetting the offset compensator by use of the second reset signal.

2. The receiving method of claim 1, further comprising:
switching the gain based on the detected level variation of the output voltage signal by switching a resistance value of a feedback resistor in the preamplifier.

3. A receiving circuit comprising:
a preamplifier configured to convert an inputted current signal into a voltage signal, which includes an amplifier in which a gain used for the conversion is variable; and
a post amplifier configured to receive an output voltage signal of the preamplifier, and includes an offset compensator configured to output an offset compensation voltage signal for the output voltage signal,
wherein the preamplifier comprises:
a level detector configured to detect a level variation of an output voltage signal of the amplifier;
a reset signal generator configured to generate a first reset signal when the level detector detects the level variation; and
an adder which adds the first reset signal generated by the reset signal generator to the output voltage signal of the amplifier, the first reset signal having a polarity opposite to that of the output voltage signal,
wherein the post amplifier includes:
a reset signal detector configured to receive the output voltage signal of the preamplifier, and to detect the first reset signal having polarity opposite to that of the output voltage signal from the received output voltage signal, and to reset the offset compensator by use of a second reset signal; and the offset compensator configured to receive the output voltage signal of the preamplifier and the second reset signal.

4. The receiving circuit according to claim 3, wherein
the preamplifier and the post amplifier are differential amplifiers, and
the reset signal, which is added to a differential output voltage signal outputted from the preamplifier, is a differential signal.

5. The receiving circuit according to claim 3, wherein
the level detector of the preamplifier includes a comparator configured to detect the level variation of the output voltage signal of the amplifier, and
the reset signal generator of the preamplifier includes an AND circuit configured to generate a reset signal whose pulse width corresponds to a delay time of a delay circuit, on the basis of an output signal of the comparator and a signal obtained by delaying and inverting the output signal of the comparator in the delay circuit.

6. The receiving circuit according to claim 5, wherein
the comparator of the level detector is a plurality of comparators having the same comparison reference value or comparison reference values different from one another, and
the reset signal generator includes:
sets of a delay circuit and an AND circuit, the number of which sets corresponds to the number of the plurality of comparators; and
an OR circuit configured to receive an output of the AND circuit of each set, and to output the reset signal.

7. The receiving circuit according to claim 3, wherein
the adder of the preamplifier includes a selector configured to select any one of the output voltage signal of the amplifier and a potential set so as to output a signal which has a polarity opposite to that of the output voltage signal, and
the selector is configured to select and output the set potential when the reset signal of the reset signal generator is outputted.

8. The receiving circuit according to claim 3, wherein the reset signal detector of the post amplifier includes a comparator configured to compare the output voltage signal of the preamplifier with a threshold below a potential of the "0" code of the output voltage signal.

9. The receiving circuit according to claim 4, wherein
the reset signal detector of the post amplifier includes an operational amplifier in which an offset is set, and
the reset signal detector is configured to compare a positive logic data signal with a negative logic data signal, and thereby detecting the reset signal added to the output data signal of the preamplifier, the positive logic data signal being inputted into one of input terminals of the operational amplifier, and the negative logic data signal being inputted to the other one of the input terminals.

* * * * *